(12) United States Patent
Bruel

(10) Patent No.: US 9,063,177 B2
(45) Date of Patent: Jun. 23, 2015

(54) ELECTRIC POWER METERING DEVICE AND METHOD

(75) Inventor: Marc Bruel, Corenc (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 935 days.

(21) Appl. No.: 13/067,408

(22) Filed: May 31, 2011

(65) Prior Publication Data

US 2011/0304321 A1    Dec. 15, 2011

(30) Foreign Application Priority Data

Jun. 14, 2010   (FR) ..................... 10 02498

(51) Int. Cl.
*G01R 21/00* (2006.01)
*G01R 11/16* (2006.01)
*G01R 22/06* (2006.01)

(52) U.S. Cl.
CPC .............. *G01R 11/16* (2013.01); *G01R 22/063* (2013.01)

(58) Field of Classification Search
CPC ...... G01R 22/063; G01R 22/00; G01R 11/16; G01R 11/00
USPC ...................................................... 324/140 R
See application file for complete search history.

(56) References Cited

U.S. PATENT DOCUMENTS

| | | | | |
|---|---|---|---|---|
| 4,119,948 A | * | 10/1978 | Ward et al. | 340/870.02 |
| 2005/0035877 A1 | * | 2/2005 | Kim | 340/870.02 |
| 2005/0280559 A1 | | 12/2005 | Bertrand | 341/22 |
| 2011/0196629 A1 | * | 8/2011 | Coutelou et al. | 702/62 |

FOREIGN PATENT DOCUMENTS

| | | | | |
|---|---|---|---|---|
| EP | 1 703 289 | | 9/2006 | |
| FR | 1000504 A1 | * | 2/2010 | G01R 21/06 |
| GB | 2 452 989 | | 3/2009 | |

OTHER PUBLICATIONS

Microchip Technology MCP3909, Energy Metering Chip Reference Guide p. 1-10, 2006.*

* cited by examiner

*Primary Examiner* — Thomas F Valone
(74) *Attorney, Agent, or Firm* — Steptoe & Johnson LLP

(57) ABSTRACT

The electric power metering device comprises a pulse meter to provide an electric pulse or a closing of an electric circuit at each predefined quantity of electric power. A communication module is connected to said pulse meter to send electric power and/or consumed electric power information. Two inputs of the communication module receive the connection with the pulse meter. Said communication module comprises discrimination means connected to the inputs to differentiate power pulse information and status information of an electric apparatus connected to said inputs. The electric power metering method comprises a discrimination step to differentiate power pulse information and status information of an electric apparatus connected to said inputs of the communication module.

11 Claims, 3 Drawing Sheets

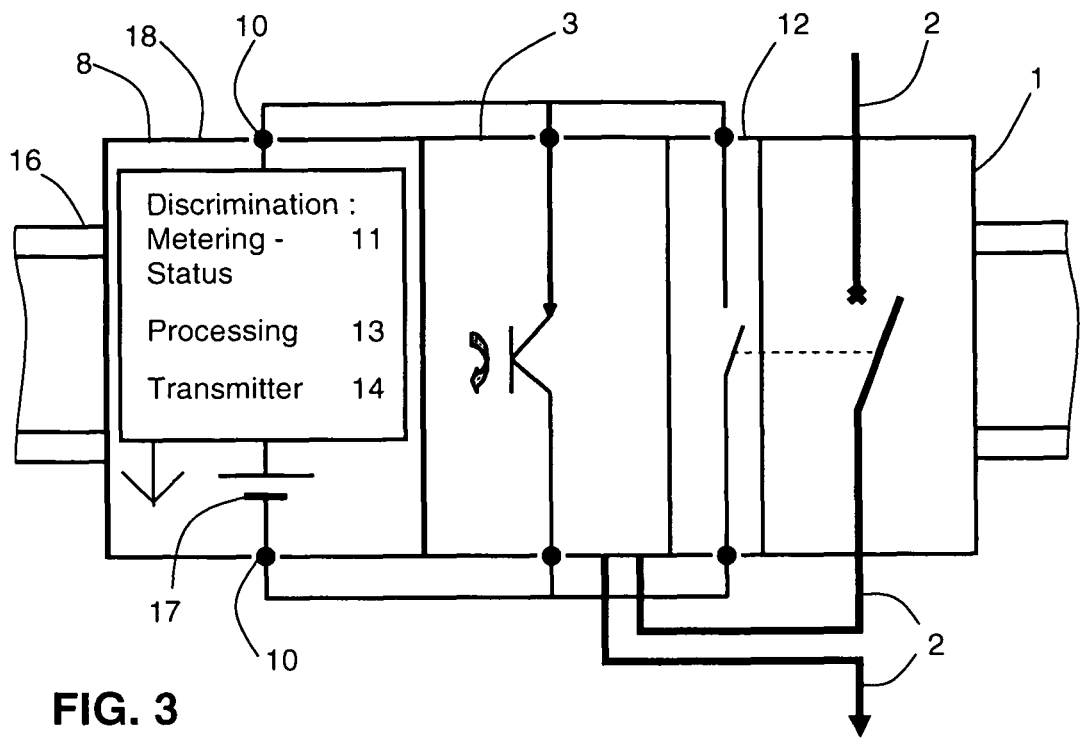
FIG. 3
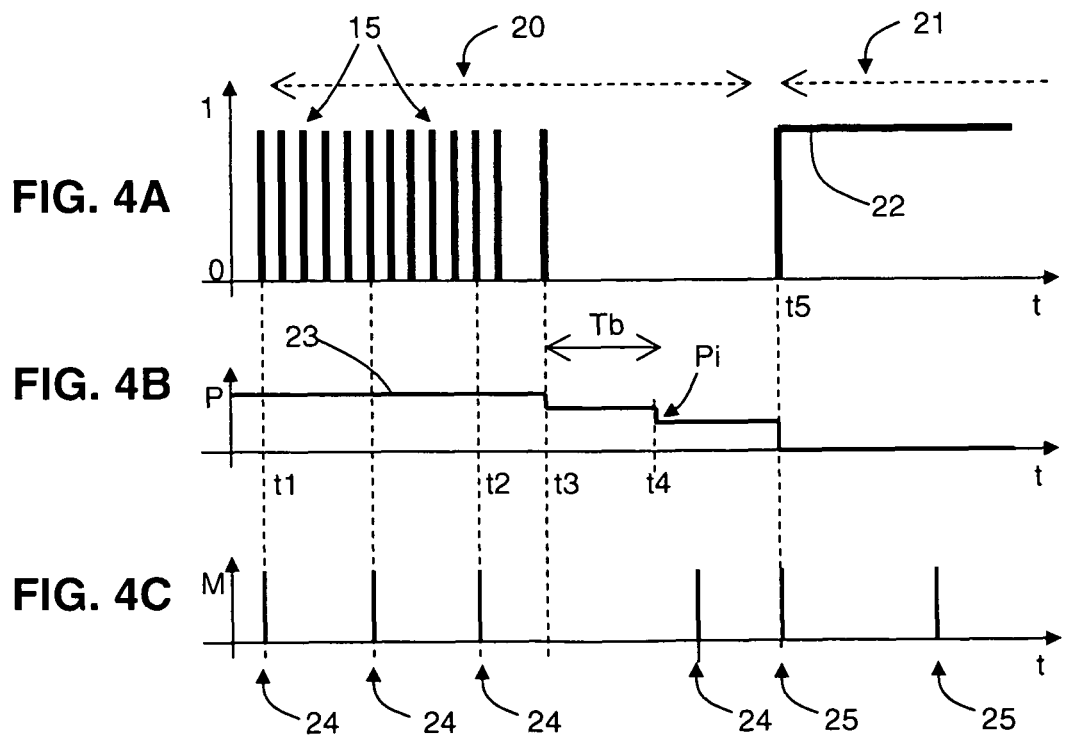
FIG. 4A
FIG. 4B
FIG. 4C

ELECTRIC POWER METERING DEVICE AND METHOD

BACKGROUND OF THE INVENTION

The invention relates to an electric power metering device comprising:
- a pulse meter to provide an electric pulse or a closing of an electric circuit at each predefined quantity of electric power, and
- a communication module connected to said pulse meter to send electric power and/or consumed electric power information, said communication module comprising two inputs to receive the connection with said pulse meter.

The invention also relates to an electric power metering method.

STATE OF THE ART

Known electric power metering devices comprise a meter transmitting electric power information using calibrated pulses. Each pulse is thus representative of a predefined quantity of electric power. The pulses are either electric pulses or electric contact closings. The meters are often associated with communication modules to remotely transmit data concerning consumed power, cumulated power consumption and/or electric power.

The communication modules can also transmit additional information in particular status information provided by electric apparatuses close to said modules. In this case, the communication module comprises several status inputs. However, the presence of several inputs has the effect of increasing the size of the communication circuit.

SUMMARY OF THE INVENTION

The object of the invention is to provide an electric power metering device and method wherein the number of communication circuit inputs can be reduced.

In an electric metering device according to the invention comprising:
- a pulse meter to provide an electric pulse or a closing of an electric circuit at each predefined quantity of electric power, and
- a communication module connected to said pulse meter to send electric power and/or consumed electric power information, said communication module comprising two inputs to receive the connection with said pulse meter, said communication module comprises discrimination means connected to said inputs to differentiate electric power pulse information and status information of an electric apparatus connected to said inputs.

In a preferred embodiment, said pulse meter and a status contact of said electric apparatus are connected in parallel on said inputs of said communication module.

The communication module advantageously comprises means for calculating a mean power between two pulses.

The communication module preferably comprises means for calculating an estimated intermediate power lower than a previous power when a predefined period without a pulse is exceeded.

The communication module preferably comprises means for transmitting electric power and/or consumed electric power messages to transmit messages at regular intervals or when the power has a greater deviation than a predefined value compared with a previous value.

In a particular embodiment, the communication module comprises means for transmitting status messages of said electric apparatus when the inputs are active during a longer period than a preset time.

A method for metering electric power according to the invention comprises:
- monitoring inputs of a communication module receiving connection of a pulse or contact closing meter and connection of a status contact of an electric apparatus,
- detecting pulses provided by said pulse meter, each pulse being representative of a predefined quantity of electric power,
- transmission of electric power and/or consumed electric power information by the communication module, and
- discrimination to differentiate power pulse information and status information of an electric apparatus connected to said communication module inputs.

The method advantageously comprises calculation of a mean power between two pulses.

The method preferably comprises calculation of an estimated intermediate power lower than a previous power when a predefined period without a pulse is exceeded.

The method preferably comprises transmission of electric power and/or consumed electric power to transmit said messages at regular intervals or when the power has a greater deviation than a predefined value compared with a previous value.

In a preferred embodiment, the method comprises transmission of status messages of said electric apparatus when said inputs are active for a longer period than a predefined time.

BRIEF DESCRIPTION OF THE DRAWINGS

Other advantages and features will become more clearly apparent from the following description of particular embodiments of the invention given for non-restrictive example purposes only and represented in the appended drawings in which:

FIG. 3 represents a diagram with a communication circuit, an electric power meter, and an electric apparatus in a device according to an embodiment of the invention;

FIGS. 4A, 4B and 4C show signals representative of processing operations in a device and a method according to an embodiment of the invention.

DETAILED DESCRIPTION OF PREFERRED EMBODIMENTS

Figure 1:
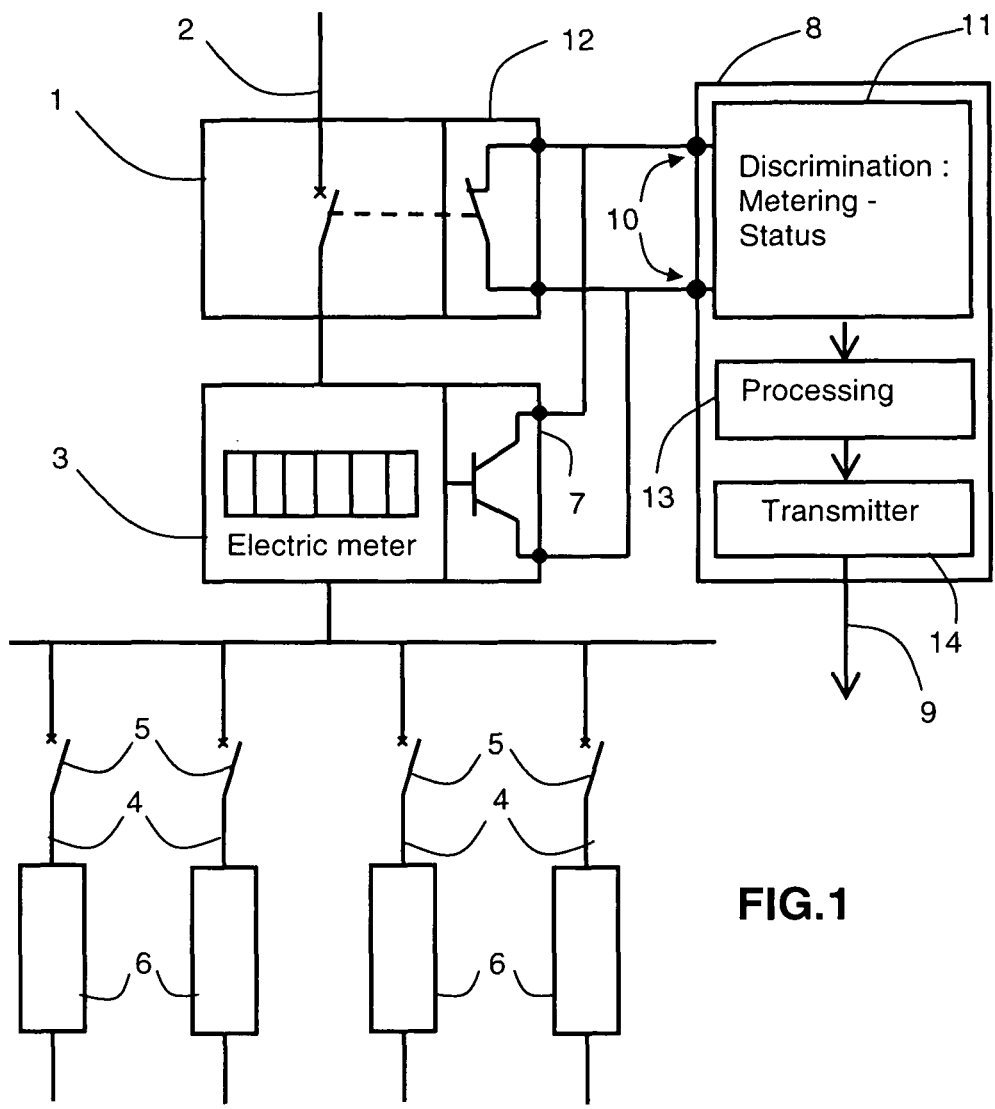
FIG. 1 represents a diagram of an installation with an electric power measuring device according to a first embodiment of the invention.

The diagram of an installation with an electric power measuring device is represented in FIG. 1. An electric apparatus 1 such as an incoming circuit breaker is connected in series with a main electric power supply line 2. An electric meter 3 is also connected in series with the main line 2 and electric apparatus 1. Electric power metering is thereby dependent on an electric current flowing in the line 2. Load-side from the meter and circuit breaker, the main line supplies several divisional feeders 4 protected by circuit breakers 5 and supplying loads 6.

The electric power metering device comprises a pulse meter 3 to provide an electric pulse or a closing of an electric circuit at each predefined quantity of electric power. An output 7 of the meter is represented by an open transistor output closing the circuit at each pulse. The metering device also comprises a communication module 8 connected to said pulse meter to send 9 electric power and/or consumed electric power information, said module comprising two inputs 10 to receive the connection with said pulse meter 3. According to an embodiment of the invention, the communication module 8 comprises a discrimination module 11 connected to said inputs 10 to differentiate power pulse information and status information of an electric apparatus 1 also connected to said inputs. The status of the electric apparatus is provided via an auxiliary status contact 12 associated with the mechanism of the apparatus. Said auxiliary contact has one or more positions according to the open, closed or tripped states in the case of a circuit breaker.

The pulse meter 3 and a status contact 12 of the electric apparatus are connected in parallel on the communication module inputs 10. The discrimination module detects status information when the inputs are activated during a predefined period that is longer than a maximum pulse duration. For example if pulses last 20 ms (milliseconds), the predefined status testing period can be 300 ms. The communication module thus transmits status messages of said electric apparatus when the inputs are active during a longer period than a predefined time period.

The communication module also comprises a processing module 13 for calculating cumulated power consumption and power in particular, as well as a transmitter to transmit information.

Figure 2:
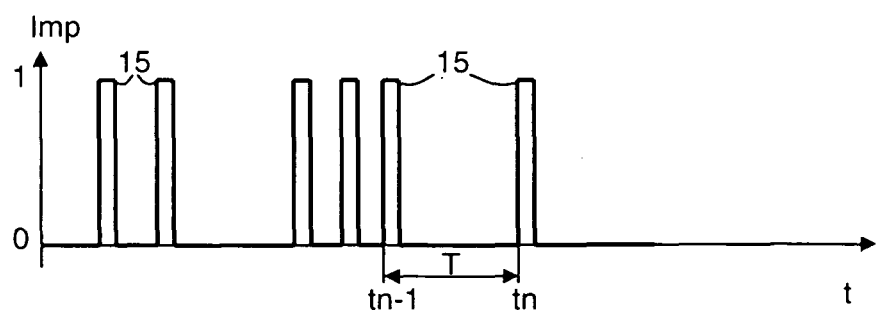
FIG. 2 shows pulse signals provided by an electric power meter to a communication circuit in a device according to an embodiment of the invention.

FIG. 2 shows pulse signals 15 provided by an electric power meter to a communication circuit. The status 1 of the pulses corresponds to an active state and to closing of the meter output 7. At each pulse, a cumulated energy value Et is incremented by a predefined value En and the power can be calculated versus the time T elapsed between two beginnings of pulses, i.e. P=En/T.

FIG. 3 represents a diagram with a communication circuit 8, an electric power meter 3, and an electric apparatus 1 with its auxiliary status contact 12 in a device according to an embodiment of the invention. These elements can be modular apparatuses arranged on a support 16 in the form of a rail. The outputs of meter 3 and of auxiliary contact 12 are connected in parallel on the inputs 10 of communication module 8. In this diagram, the communication module 8 comprises a chargeable or disposable battery 17 and a global communication processing circuit 18 comprising the functions of discrimination module 11, of processing module 13 for calculating cumulated power and power, and of transmitter 14. The circuit 18 and battery are connected between the inputs 10 of module 8.

FIGS. 4A, 4B and 4C show processing values in a device and a method according to an embodiment of the invention. FIG. 4A shows the status of the inputs 10 of communication module 8. During a first period 20, the inputs receive electric power metering pulses 15 whereas during a second period 21 starting from a time is a status signal 22 appears continuously. FIG. 4B shows a curve plot 23 representative of determination of a mean power value such that P=En/T, T being the period between two consecutive pulses. When the pulses are regular, the mean power is constant, for example between times t1 and t2. If the pulses are more distant, power P decreases as at time t3. In the case where the time intervals between two pulses become too long or the pulses stop, the communication module calculates an estimated intermediate power value Pi lower than a previous power when a predefined period without any pulse is exceeded. For example at time t4, a period Tb without a pulse is exceeded and the power value P is reduced. FIG. 4C shows sending 24 of messages performed by communication module 8. Sending of messages comprising electric power and/or consumed electric power values are thus preferably transmitted at regular intervals or when the power has a deviation greater than a predefined value compared with a previous value. Sending of messages 25 can also be triggered when a particular event occurs, in particular by detection of closing of a status contact on inputs 10.

Figure 5:
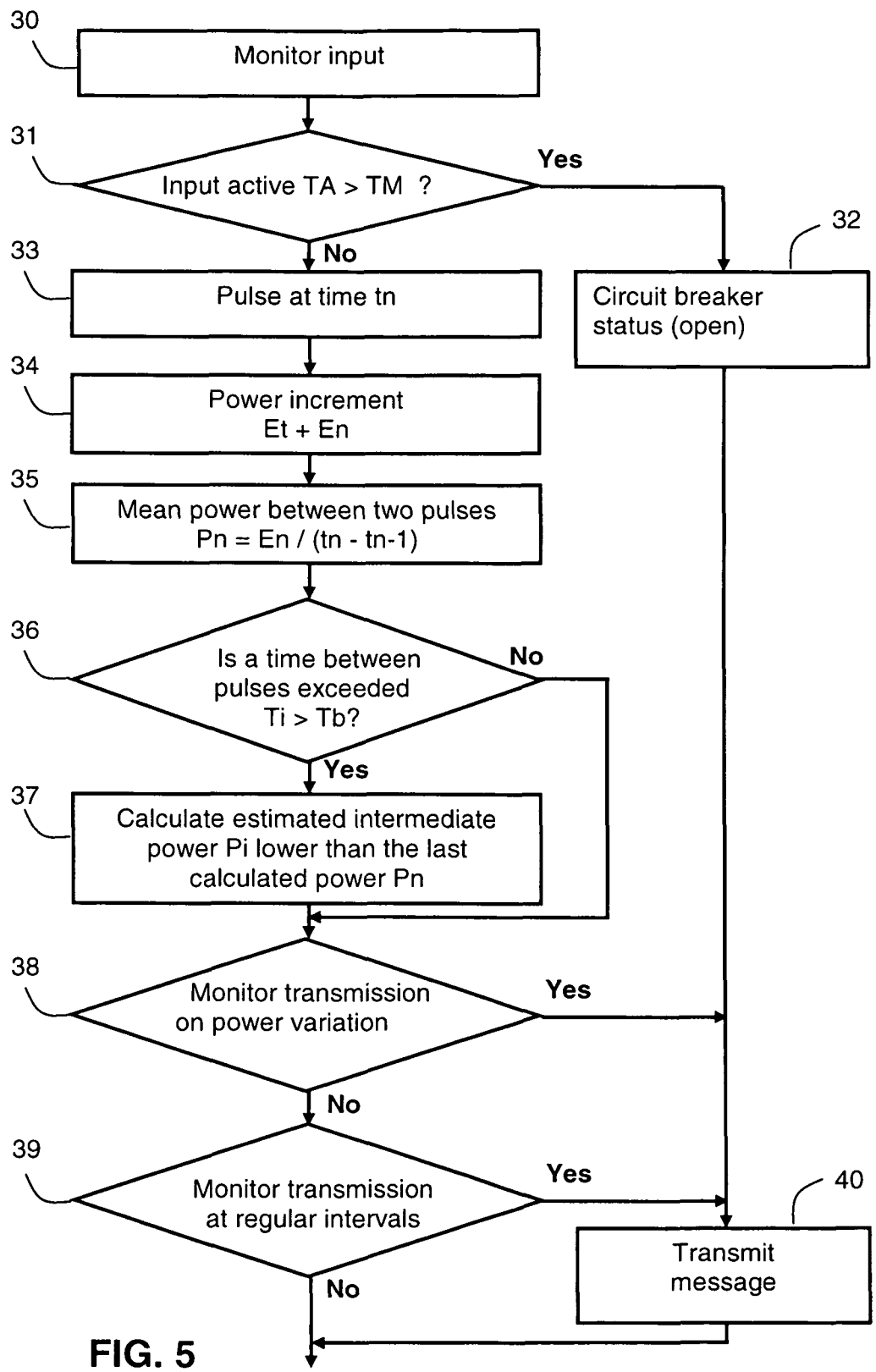
FIG. 5 represents a flowchart of an electric power metering method according to an embodiment of the invention.

FIG. 5 represents a flowchart of an electric power metering method according to an embodiment of the invention. The method comprises a first step 30 of monitoring inputs 10 of a communication module 8 receiving connection of a contact closing pulse meter 3 and connection of a status contact 12 of an electric apparatus 1. A step 31 performs discrimination to differentiate power pulse information and status information of an electric apparatus connected to said communication module inputs, If the inputs 10 are active during a period TA greater than a maximum period TM, then a status of said contact is detected in step 32. In the case of pulses, the period TA is much shorter than TM. In a step 33, detection of pulses provided by a pulse meter is performed, each pulse being representative of a predefined quantity of electric power. A step 34 calculates a cumulated energy Et by incrementing a previous value by a predefined value En at each pulse.

Calculation of a mean power Pn between two pulses is performed in a step 35. In this case, the power Pn is dependent on the time between two pulses, For example, if a pulse occurs at a time to and a previous pulse occurred at a time to-1, the value of the mean power between two pulses is Pn=En/(tn-tn-1) where En is the energy value assigned to each pulse.

A step 36 checks whether a period without a pulse exceeds a maximum monitoring time Tb in order not to keep a high power value whereas the power decreases following spacing apart of the pulses. Thus, if the time Tb is exceeded, a step 37 calculates an estimated intermediate power Pi lower than a previous power Pn.

A step 38 monitors transmission of electric power and/or consumed electric power messages to transmit messages when the power has a greater deviation than a predefined value compared with a previous value. A step 39 monitors transmission of electric power and/or consumed electric power messages to transmit messages at regular intervals dependent on time and/or on a predefined number of pulses.

A step 40 performs transmission of electric power and/or consumed electric power information messages, in particular under the conditions defined by the monitoring of steps 38 or 39. In the flowchart of FIG. 5, step 40 also performs transmission of status messages of said electric apparatus when said inputs are active during a longer time than a predefined time. In this case, step 40 is also activated by step 32.

In the embodiments described in the foregoing, the electric apparatus is in particular a circuit breaker with an auxiliary contact. However, the invention also applies to assemblies or any type of apparatus comprising a status contact able to be associated with a pulse meter.

The invention claimed is:
1. An electric power metering device comprising:
a pulse meter for providing an electric pulse by closing an electric circuit to provide a predefined quantity of electric power, an electric apparatus connected in series with the pulse meter, and a communication module connected to said pulse meter for sending electric power and/or consumed electric power information, said communication module comprising two inputs for connection with said pulse meter, wherein said communication module comprises discrimination means connected to said inputs for differentiating electric power pulse information and status information of said electric apparatus.

2. The device according to claim 1 wherein said electric apparatus includes a status contact, and said pulse meter and a status contact of said electric apparatus are connected in parallel to said inputs of said communication module.

3. The device according to claim 1 wherein the communication module comprises means for calculating a mean power between two successive pulses.

4. The device according to claim 3 wherein the communication module comprises means for calculating an estimated intermediate power between two successive pulses, when a predefined time without a puke is exceeded, said estimated intermediate power limited to be lower than an intermediate power in an interval between two earlier successive pulses.

5. The device according to claim 1 wherein the communication module comprises means for transmitting electric power, and/or consumed electric power messages, at regular intervals or When the power has a larger deviation than a predefined value compared with a previous value.

6. The device according to claim 1 Wherein the communication module comprises means for transmitting messages of the status of said electric apparatus when the inputs are active for a longer time than a predefined time.

7. A method for metering electric power supplied to an electric apparatus connected in series with a pulse meter for providing an electric pulse which provides a predefined quantity of electric power, and a communication module connected to said pulse meter for sending electric power and/or consumed electric power information, said communication module comprising two inputs for connection with said pulse meter, wherein the communication module comprises discrimination means connected to said inputs for differentiating electric power pulse information and status information of said electric apparatus, said method comprising:

monitoring inputs to the communication module received from the pulse meter, each pulse being representative of a predefined quantity of electric power, transmission of electric power, and/or consumed electric power information, and differentiating power pulse information and status information received from the electric apparatus connected to said inputs of the communication module.

8. The method according to claim 7 comprising calculation of an estimated intermediate power lower than a previous intermediate power between two pulses, when a predefined time without a pulse is exceeded.

9. The method according to claim 7 comprising transmission of electric power, and/or consumed electric power messages, at regular intervals or when the power has a greater deviation than a predefined value relative to a previous value at a time intermediate between two prior pulses.

10. The method according to claim 7 comprising transmission of status messages of said electric apparatus when said inputs are active for a longer time than a predefined time.

11. The method according to claim 7 comprising calculation of a mean power between two pulses.

\* \* \* \* \*